United States Patent
Baek et al.

(10) Patent No.: US 12,125,945 B2
(45) Date of Patent: Oct. 22, 2024

(54) SINGLE CHIP MULTI BAND LED

(71) Applicant: SEOUL VIOSYS CO., LTD., Gyeonggi-do (KR)

(72) Inventors: Yong Hyun Baek, Gyeonggi-do (KR); Ji Hun Kang, Gyeonggi-do (KR); Chae Hon Kim, Gyeonggi-do (KR); Ji Hoon Park, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/097,319

(22) Filed: Jan. 16, 2023

(65) Prior Publication Data

US 2023/0215977 A1    Jul. 6, 2023

Related U.S. Application Data

(63) Continuation of application No. 17/165,177, filed on Feb. 2, 2021, now Pat. No. 11,557,695.

(60) Provisional application No. 62/969,936, filed on Feb. 4, 2020.

(51) Int. Cl.
*H01L 33/24* (2010.01)
*H01L 33/06* (2010.01)
*H01L 33/32* (2010.01)

(52) U.S. Cl.
CPC ............. *H01L 33/24* (2013.01); *H01L 33/06* (2013.01); *H01L 33/32* (2013.01)

(58) Field of Classification Search
CPC .......... H01L 33/24; H01L 33/06; H01L 33/32
See application file for complete search history.

(56) References Cited

U.S. PATENT DOCUMENTS

| | | | |
|---|---|---|---|
| 11,557,695 B2* | 1/2023 | Baek | H01L 33/24 |
| 2018/0138362 A1* | 5/2018 | Kim | H01L 33/22 |
| 2018/0351039 A1* | 12/2018 | Kim | H01L 33/325 |
| 2019/0296187 A1 | 9/2019 | Yoo et al. | |
| 2020/0119228 A1* | 4/2020 | Lehnhardt | H01L 33/025 |

(Continued)

FOREIGN PATENT DOCUMENTS

| | | |
|---|---|---|
| CN | 105552188 A | 5/2016 |
| KR | 1020070042983 A | 4/2007 |

(Continued)

OTHER PUBLICATIONS

Chang et al., Manipulation of nanoscale V-pits to optimize internal quantum efficiency pf InGaN multiple quantum wells, Applied Physics Letters, Mar. 4, 2015, pp. 1-5, vol. 106, issue No. 091104, AIP Publishing LLC.

(Continued)

*Primary Examiner* — Mark W Tornow
(74) *Attorney, Agent, or Firm* — LaBatt, LLC

(57) ABSTRACT

A light emitting diode includes an n-type nitride semiconductor layer, a V-pit generation layer located over the n-type nitride semiconductor layer and having a V-pit, an active layer located on the V-pit generation layer, and a p-type nitride semiconductor layer located on the active layer. The active layer includes a well layer, which includes a first well layer portion formed along a flat surface of the V-pit generation layer and a second well layer portion formed in the V-pit of the V-pit generation layer. The active layer emits light having at least two peak wavelengths at a single chip level.

22 Claims, 11 Drawing Sheets

(56) References Cited

U.S. PATENT DOCUMENTS

2021/0126162 A1* 4/2021 Han ................... H01L 33/025
2021/0305455 A1   9/2021 Yang
2021/0328100 A1  10/2021 Baek

FOREIGN PATENT DOCUMENTS

KR      10-1722694 B1  10/2015
KR   1020170063211 A    6/2017

OTHER PUBLICATIONS

Zhang et al., Study on carrier transportation in InGaN based green LEDs with V-pits structure in the active region, Optical Materials 86 (2018) pp. 46-50.
International Search Report for international Application No. PCT/KR2021/001423, mailed May 24, 2021, English Translation, 5 pages.
Office Action, U.S. Appl. No. 17/165,177, filed Jun. 8, 2022. 9 pages.
Notice of Allowance, U.S. Appl. No. 17/165,177, dated Nov. 30, 2022. 7 pages.
Sawicka et al., "Indium incorporation in semipolar (2021) and nonpolar (1010) InGaN grown by plasma assisted molecular beam epitaxy", Journal of Crystal Growth, Elseview, Amsterdam, NL, vol. 459, Nov. 29, 2016, pp. 129-134.
Application No. EP 21 74 9993, Supplementary European Search Report dated Nov. 27, 2023.

* cited by examiner

Comp. Example 1

Example 1

Comp. Example 1

Example 1

Example 1

Example 2

Example 3

Example 2

Example 3

Example 2

Example 3

Example 4

Example 4

SINGLE CHIP MULTI BAND LED

CROSS-REFERENCE OF RELATED APPLICATIONS AND PRIORITY

The present application is a continuation of U.S. patent application Ser. No. 17/165,177, filed Feb. 2, 2021, which claims the benefit of U.S. Provisional Application Ser. No. 62/969,936, filed Feb. 4, 2020, the disclosures of which are incorporated herein by reference in their entireties.

TECHNICAL FIELD

The present disclosure relates to a light emitting diode, and more particularly, to a light emitting diode that emits light having multi-bands at a single chip level.

BACKGROUND

A nitride semiconductor is used as a light source of a display apparatus, traffic light, lighting, or an optical communication device, and is mainly used in a light emitting diode or a laser diode that emits blue or green light. In addition, the nitride semiconductor may be used in a heterojunction bipolar transistor (HBT), a high electron mobility transistor (HEMT), and the like.

In general, a light emitting diode using the nitride semiconductor has a heterojunction structure having a quantum well structure between an N contact layer and a P contact layer. The light emitting diode emits light according to a composition of a well layer in the quantum well structure. In order to increase an internal quantum efficiency and reduce the loss due to light absorption, the light emitting diode is designed to emit light of a spectrum having a single peak, that is, monochromatic light.

Mixed color light, such as white light, emitted from lighting or the like cannot be implemented as single-peak monochromatic light. Accordingly, a technique of implementing white light by using a plurality of light emitting diodes together emitting different monochromatic light from each other or by using phosphor converting a wavelength of light emitted from the light emitting diode is generally used.

The use of phosphors comes with cost of phosphor or a decrease in efficiency known as a Stoke's shift. In addition, a process of coating phosphor on the light emitting diode and yellowing of a carrier carrying phosphor should be considered.

Using a mixture of a plurality of light emitting diodes also complicates the process, and it is inconvenient to prepare light emitting diodes made of different materials.

SUMMARY

Using a single-chip light emitting diode may implement light having a spectrum of multi bands, and use of a plurality of light emitting diodes and phosphor may be avoided.

There have been attempts to implement light having a spectrum of multi bands by varying compositions of the well layers in the conventional quantum well structure, but satisfactory achievement has not been obtained. In particular, recombination of electrons and holes mainly occurs in a particular well layer, and it is difficult to generate light having multi bands.

Exemplary embodiments provide a light emitting diode of a novel structure capable of implementing light having a spectrum of multi bands at a single chip level.

A light emitting diode according to one or more embodiments of the present disclosure includes an n-type nitride semiconductor layer, a V-pit generation layer located over the n-type nitride semiconductor layer and having a V-pit, an active layer located on the V-pit generation layer, and a p-type nitride semiconductor layer located on the active layer. The active layer includes a well layer, the well layer including a first well layer portion formed along a flat surface of the V-pit generation layer and a second well layer portion formed in the V-pit of the V-pit generation layer. The active layer emits light having at least two peak wavelengths at a single chip level.

A light emitting diode according to one or more embodiments of the present disclosure includes an n-type nitride semiconductor layer, a V-pit generation layer located over the n-type nitride semiconductor layer and having a V-pit; an active layer located on the V-pit generation layer, a p-type AlGaN layer located on the active layer, and a p-type nitride semiconductor layer located on the p-type AlGaN layer. The active layer includes a well layer, the well layer including a first well layer portion formed along a flat surface of the V-pit generation layer and a second well layer portion formed in the V-pit of the V-pit generation layer. The first well layer portion and the second well layer portion emit light having different peak wavelengths from each other.

DETAILED DESCRIPTION OF THE EMBODIMENTS

Figure 1:
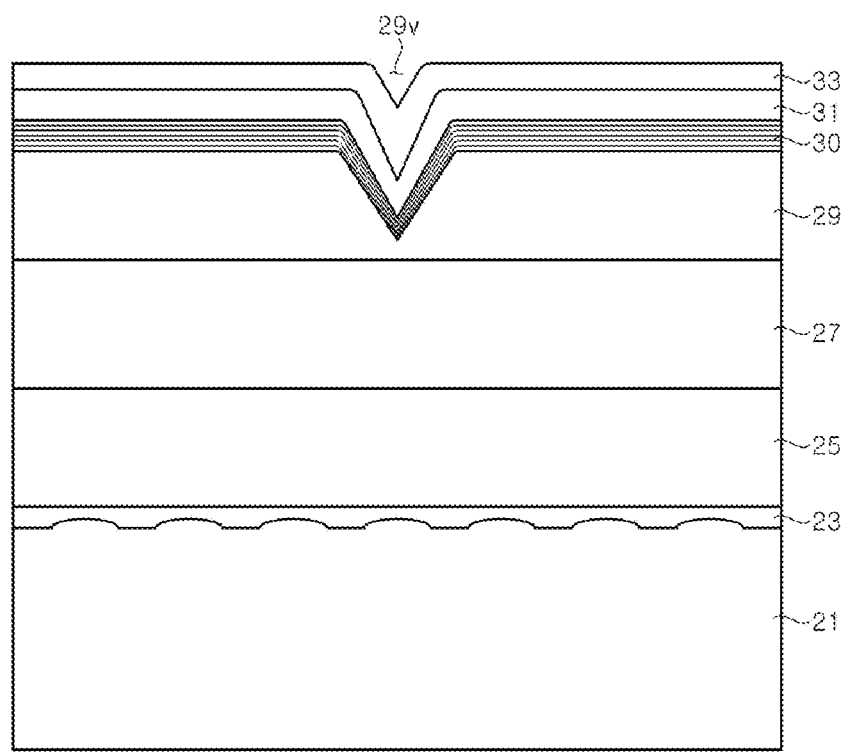
FIG. 1 is a schematic cross-sectional view illustrating a light emitting diode according to one or more embodiments of the present disclosure.

Hereinafter, embodiments will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of devices can be exaggerated for clarity and descriptive purposes. When an element or layer is referred to as being "disposed above" or "disposed on" another element or layer, it can be directly "disposed above" or "disposed on" the other element or layer or intervening devices or layers can be present. Throughout the specification, like reference numerals denote like devices having the same or similar functions.

A light emitting diode according to one or more embodiments of the present disclosure includes an n-type nitride semiconductor layer, a V-pit generation layer located over the n-type nitride semiconductor layer and having a V-pit, an active layer located on the V-pit generation layer; and a p-type nitride semiconductor layer located on the active layer. The active layer includes a well layer, the well layer including a first well layer portion formed along a flat surface of the V-pit generation layer and a second well layer portion formed in the V-pit of the V-pit generation layer, and the light emitting diode emits light having at least two peak wavelengths at a single chip level.

In at least one variant, light having a spectrum of multi bands may be emitted without phosphor, and thus, it is possible to address many drawbacks of the prior art according to the use of phosphor.

The first well layer portion may emit light having a first peak wavelength, and the second well layer portion may emit light having at least one second peak wavelength.

In another variant, the first well layer portion may emit light having a yellow peak wavelength, and the second well layer portion may emit light having a blue peak wavelength.

In yet another variant, the first well layer portion may emit light having a yellow peak wavelength, and the second well layer portion emits light having a blue peak wavelength and light having a green peak wavelength.

The first well layer portion may have a higher Indium (In) content than that of the second well layer portion. In addition, the first well layer portion may be thicker than the second well layer portion.

The light emitting diode may further include a p-type $Al_xGa_{1-x}N$ layer interposed between the active layer and the p-type nitride semiconductor layer, in which a composition ratio x of Al in the p-type AlGaN layer is greater than 0 and less than 0.3.

Further, the p-type $Al_xGa_{1-x}N$ layer may have a thickness of less than 100 nm.

Meanwhile, the V-pit generation layer may have a thickness exceeding 450 nm. In addition, the V-pits formed in the V-pit generation layer may include a V-pit having a width of an inlet exceeding 300 nm.

Meanwhile, the active layer may have a multiple quantum well structure having a plurality of well layers and a plurality of barrier layers, and may further include a capping layer covering the well layer between the well layer and the barrier layer, in which the capping layer may contain Al.

Furthermore, the capping layer may contain 10 atomic % or more of Al with respect to a total Al composition in the capping layer.

The p-type nitride semiconductor layer may include a concave portion on the V-pit.

In further another variant, the active layer may contact the V-pit generation layer. More particularly, a barrier layer of the active layer may be directly formed on the V-pit generation layer.

A light emitting diode according to one or more embodiments of the present disclosure includes an n-type nitride semiconductor layer, a V-pit generation layer located over the n-type nitride semiconductor layer and having a V-pit, an active layer located on the V-pit generation layer; a p-type AlGaN layer located on the active layer, and a p-type nitride semiconductor layer located on the p-type AlGaN layer. The active layer includes a well layer, the well layer including a first well layer portion formed along a flat surface of the V-pit generation layer and a second well layer portion formed in the V-pit of the V-pit generation layer, and the first well layer portion and the second well layer portion may emit light having different peak wavelengths from each other.

The second well layer portion may emit light having a shorter wavelength than that of light emitted from the first well layer portion. In an exemplary embodiment, the second well layer portion may emit light having at least two peak wavelengths.

Meanwhile, the p-type AlGaN layer may be represented by a general formula of $Al_xGa_{1-x}N$, where a composition ratio x of Al in the p-type AlGaN layer may be greater than 0 and less than 0.3.

The p-type AlGaN layer may have a thickness of less than 100 nm.

Meanwhile, the V-pit generation layer may have a thickness exceeding 450 nm, and the V-pits formed in the V-pit generation layer may include a V-pit having a width of an inlet exceeding 300 nm.

Figure 2A:
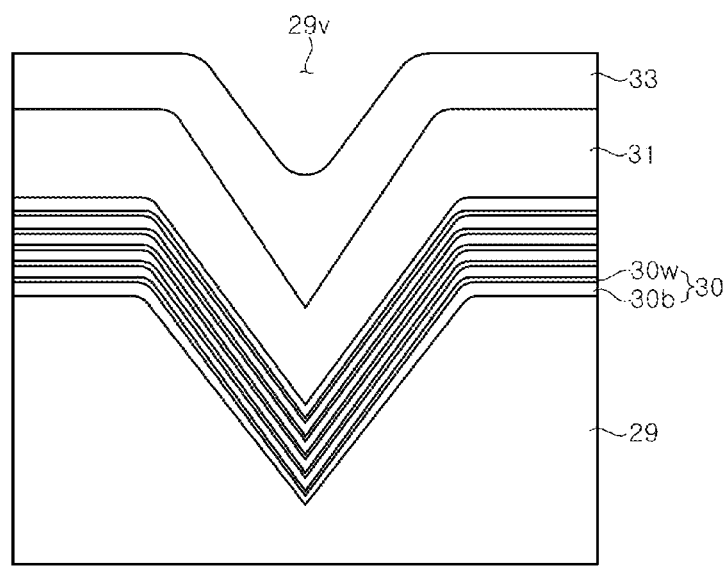
FIG. 2A is a schematic partial cross-sectional view showing an enlarged portion of FIG. 1 to describe a light emitting diode.
Figure 2B:
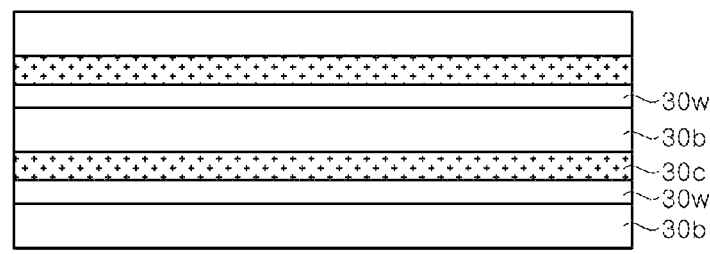
FIG. 2B is a schematic partial cross-sectional view showing an enlarged portion of FIG. 2A to describe a light emitting diode.
Figure 3:
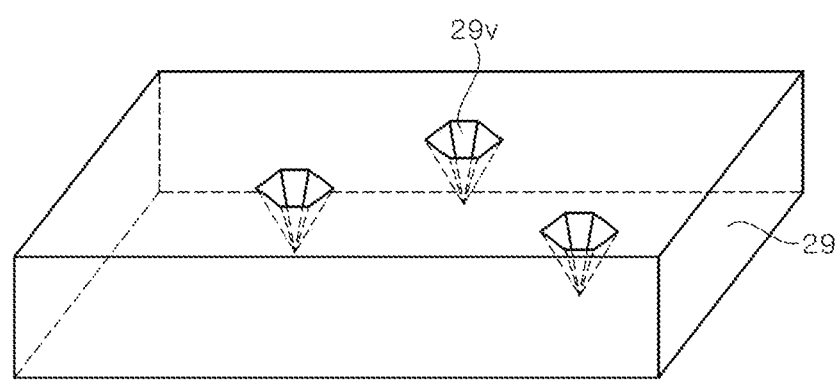
FIG. 3 is a schematic perspective view showing an enlarged V-pit generation layer to describe a light emitting diode according to one or more embodiments of the present disclosure.

FIG. 1 is a schematic cross-sectional view illustrating a light emitting diode according to an exemplary embodiment. FIG. 2A is a schematic partial cross-sectional view showing an enlarged portion of FIG. 1 to describe the light emitting diode according to an exemplary embodiment. FIG. 2B is a schematic partial cross-sectional view showing an enlarged portion of FIG. 2A to describe the light emitting diode according to an exemplary embodiment. FIG. 3 is a schematic perspective view showing an enlarged V-pit generation layer to describe the light emitting diode according to an exemplary embodiment.

First, referring to FIG. 1, the light emitting diode may include a substrate 21, a nucleation layer 23, a high-temperature buffer layer 25, an n-type nitride semiconductor layer 27, a V-pit generation layer 29, and an active layer 30, a p-type AlGaN layer 31, and a p-type nitride semiconductor layer 33.

The substrate 21 is for growing a gallium nitride-based semiconductor layer, and a sapphire substrate, a SiC substrate, a Si substrate, a spinel substrate, or the like may be used as the substrate 21. The substrate 21 may have protrusions as shown in FIG. 1, and may be, for example, a patterned sapphire substrate. However, the inventive concepts are not limited thereto, and may be a substrate having a flat upper surface thereof, for example, a sapphire substrate.

The nucleation layer 23 may be formed of (Al, Ga)N on the substrate 21 at a low temperature of 400° C. to 600° C., and for example, may be formed of AlGaN or GaN. A composition of the nucleation layer 23 may be changed according to the substrate 21. For example, when the substrate 21 is a patterned sapphire substrate, the nucleation layer 23 may be formed of AlGaN, and when the substrate 21 is a sapphire substrate having a flat upper surface, the nucleation layer 23 may be formed of GaN. The nucleation layer 23 may be formed to have a thickness of about 25 nm, for example.

The high-temperature buffer layer 25 may be grown at a relatively high temperature so as to mitigate occurrence of defects such as dislocations between the substrate 21 and the n-type nitride semiconductor layer 27. The high-temperature buffer layer 25 may be formed of undoped GaN or GaN doped with n-type impurities. While the high-temperature buffer layer 25 is being formed, threading dislocations are generated due to lattice mismatch between the substrate 21 and the high-temperature buffer layer 25. The high-temperature buffer layer 25 may be formed to have a thickness of, for example, about 4.2 μm.

The n-type nitride semiconductor layer 27 is a nitride-based semiconductor layer doped with n-type impurities, and may be formed of, for example, a GaN layer doped with Si. A doping concentration of Si doped to the n-type nitride semiconductor layer 27 may be from $5E17/cm^2$ to $5E19/cm^2$. The n-type nitride semiconductor layer 27 may be grown under a growth pressure of 150 Torr to 200 Torr at 1000° C. to 1200° C. (for example, 1050° C. to 1100° C.) by supplying a metal source gas into a chamber using MOCVD technology. In this case, the n-type nitride semiconductor layer 27 may be continuously formed on the high-temperature buffer layer 25, and the threading dislocations formed in the high-temperature buffer layer 25 may be transferred to the n-type nitride semiconductor layer 27. The n-type nitride semiconductor layer 27 may be formed to be relatively thinner than the high-temperature buffer layer 25, and may be formed to have, for example, a thickness of about 2.5 μm.

The V-pit generation layer 29 is located over the n-type nitride semiconductor layer 27. In an exemplary embodiment, the V-pit generation layer 29 may be formed of, for example, a GaN layer. The V-pit generation layer 29 may be grown at a temperature relatively lower than that for growing the n-type nitride semiconductor layer 27, for example, about 900° C., and thus, V-pits are formed in the V-pit generation layer 29.

Since the V-pit generation layer 29 is grown at a relatively lower temperature than that for growing the n-type nitride semiconductor layer 27, crystal quality may be artificially degraded and promote three-dimensional growth, and thus, a V-pit 29v may be formed.

As shown in FIG. 3, when a growth surface of the nitride semiconductor layer is a C-plane, the V-pits 29v may have a hexagonal cone shape. The V-pits 29v may be formed at upper ends of the threading dislocations.

The V-pit generation layer 29 may be formed to have a thickness thinner than that of the n-type nitride semiconductor layer 27, and may be formed to have, for example, a thickness of about 450 nm to 600 nm. A size of the V-pits 29v formed in the V-pit generation layer 29 may be adjusted through a growth condition and a growth time of the V-pit generation layer 29. In an exemplary embodiment, a maximum width of an inlet of the V-pit 29v formed in the V-pit generation layer 29 may generally exceed about 230 nm.

The thickness of the V-pit generation layer 29 particularly affects the size of the V-pit 29v. Moreover, the size of the V-pit 29v is considered to have an effect on generating light having a spectrum of multi bands.

In the illustrated exemplary embodiment, the V-pit generation layer 29 is described as being a single layer by way of example, but the inventive concepts are not limited thereto, and the V-pit generation layer 29 may be multiple layers. For example, the V-pit generation layer 29 may include at least two layers among GaN, AlGaN, InGaN, or AlGaInN layers.

The active layer 30 is located on the V-pit generation layer 29. The active layer 30 emits light by recombination of electrons and holes. In addition, the active layer 30 may have a single quantum well structure or a multiple quantum well (MQW) structure in which barrier layers 30b and well layers 30w are alternately stacked, as shown in FIGS. 2A and 2B.

The active layer 30 may contact the V-pit generation layer 29, but the inventive concepts are not limited thereto. The active layer 30 may be formed along the V-pit 29v. A thickness of the active layer 30 formed in the V-pit 29v is smaller than that of the active layer 30 formed on a flat surface of the V-pit generation layer 29. The thickness of the active layer 30 in the V-pit 29v may vary depending on a depth of the V-pit 29v. At an intermediate depth of the V-pit 29v, the thickness of the active layer 30 may be less than about 3 of the thickness of the active layer 30 formed on the flat surface of the V-pit generation layer 29. In particular, a thickness of the well layer 30w at the intermediate depth of the V-pit 29v may be less than about ⅓ of the thickness of the well layer 30w formed on the flat surface of the V-pit generation layer 29.

Meanwhile, the well layer 30w may be formed of $In_xAl_yGa_{1-x-y}N$ (0<x<1, 0<y<1). A composition ratio of In, Al, and Ga may be selected according to required light. In particular, the well layer 30w (hereinafter, a first well layer portion) formed on the flat surface of the V-pit generation layer 29 has a composition that emits light having a longer wavelength spectrum of the multi bands. Meanwhile, the well layer 30w (hereinafter, a second well layer portion) formed in the V-pit 29v has a composition that emits light having a shorter wavelength spectrum of the multi bands. For example, an Indium (In) composition ratio in the first well layer portion is higher than that in the second well layer portion, the first well layer portion may be formed of InGaN to emit yellow light, and the second well layer portion may be formed of InGaN to emit green and/or blue light.

The second well layer portion may be formed with an identical composition on each side surface of the V-pit 29v, but the inventive concepts are not limited thereto, and may be formed with a different composition from one another on each side surface. As such, the light emitting diode of the present disclosure may implement light having at least two bands at a single chip level using the first well layer portion and the second well layer portion. In other words, a single chip includes the first well layer portion and the second well layer portion, which enables light having at least two bands to be emitted without using phosphor.

The barrier layer 30b may be formed of a nitride semiconductor layer such as GaN, InGaN, AlGaN, AlInGaN, or the like, which has a wider band gap than that of the well layer 30w. For example, when the first well layer portion is formed of InGaN to emit yellow light, the barrier layer 30b may be formed of InGaN having a lower Indium (In) content than that of the well layer 30w.

Meanwhile, as shown in FIG. 2B, a capping layer 30c may be interposed between the well layer 30w and the barrier layer 30b. The capping layer 30c may be formed before the deposition of the barrier layer 30b to prevent Indium (In) in the well layer 30w from being dissociated while the barrier layer 30b is deposited. The capping layer 30c may include Al, and may be formed of, for example, AlGaN or AlInGaN. An Al composition of a first capping layer portion, that is, a capping layer portion disposed on the flat surface of the V-pit generation layer 29, and an Al composition of a second capping layer portion, that is, a capping layer portion formed in the V-pit 29v may be different from each other. The Al content in the first capping layer portion is higher than that in the second capping layer portion. For example, the Al composition in the first capping layer portion may be 10 atomic % or more, further 12 atomic % or more with respect to a total Al composition in the capping layer, and the Al composition in the second capping layer portion may be about 5 atomic % or more with respect to the total Al composition in the capping layer.

Capping layers 30c may be formed to have a thickness substantially similar to or smaller than that of an adjacent well layer 30w.

The p-type AlGaN layer 31 is located on the active layer 30. The p-type AlGaN layer 31 may also be formed in the V-pit 29v. A composition ratio of Al in the p-type AlGaN layer 31 is relatively low compared to a composition ratio of Al used in an electron blocking layer. In addition, the composition ratio of Al in the p-type AlGaN layer 31 may be smaller than that in the capping layer 30c. For example, the p-type AlGaN layer 31 may be represented by a general formula $Al_xGa_{1-x}N$, where x may be greater than 0 and less than 0.3. Meanwhile, in an exemplary embodiment, a thickness of the p-type AlGaN layer 31 may be less than about 100 nm, and in a particular exemplary embodiment, it may be about 70 nm.

The p-type nitride semiconductor layer 33 may be formed of, for example, GaN, a semiconductor layer doped with p-type impurities such as Mg. The p-type nitride semiconductor layer 33 may be a single layer or multiple layers, and may include a p-type contact layer. As shown in FIG. 1, the p-type nitride semiconductor layer 33 may have a concave groove in the V-pit 29v. Since the p-type nitride semiconductor layer 33 does not completely fill the V-pit 29v, loss of light generated in the well layer 30w in the V-pit 29v may be prevented.

Figure 4A:
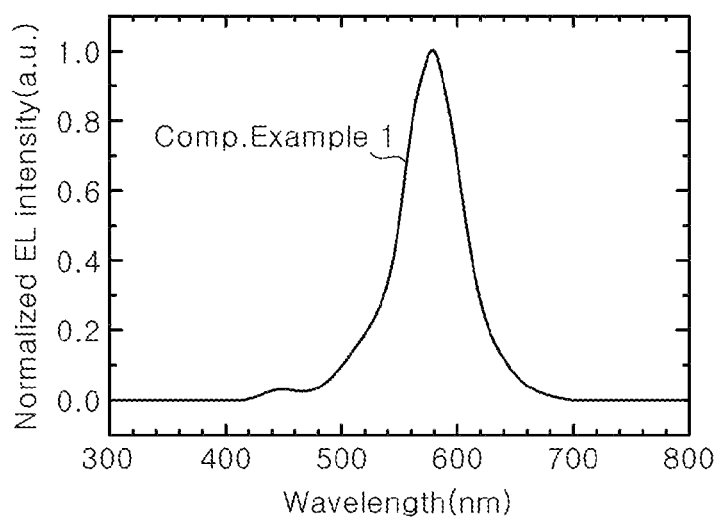
FIG. 4A is a graph showing an emission spectrum of a yellow light emitting diode according to Comparative Example 1.
Figure 4B:
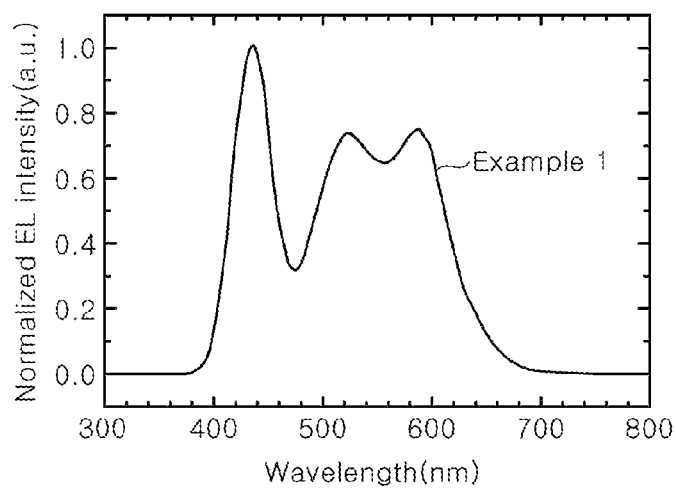
FIG. 4B is a graph showing an emission spectrum of a light emitting diode according to Inventive Example 1.
Figure 5A:
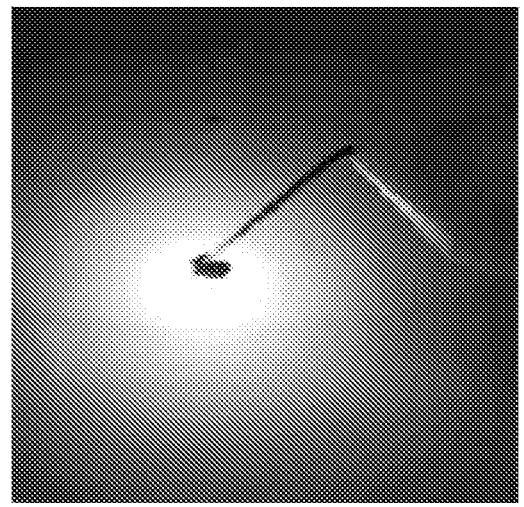
FIG. 5A is a photograph illustrating light emitted from a yellow light emitting diode according to Comparative Example 1.

FIG. 4A is a graph showing an emission spectrum of a yellow light emitting diode according to Comparative Example 1, and FIG. 4B is a graph showing an emission spectrum of a light emitting diode according to Inventive Example 1. FIG. 5A is a photograph illustrating light emitted from the yellow light emitting diode according to Comparative Example 1, and FIG. 5B is a photograph illustrating light emitted from the light emitting diode according to Inventive Example 1.

In Comparative Example 1 and Inventive Example 1, semiconductor layers were grown under similar process conditions using a sapphire substrate having a flat upper surface as a growth substrate, but deposition times of V-pit generation layers 29 thereof were different. That is, in Inventive Example 1, a deposition time of the V-pit generation layer 29 is longer than that of the V-pit generation layer 29 in Comparative Example 1. Meanwhile, three well layers were formed in Comparative Example 1 and Inventive Example 1, respectively.

Referring to FIGS. 4A and 5A, under a current of 50 mA, Comparative Example 1 shows a spectrum of a single band having a single peak in a yellow wavelength band. Light emitted from the light emitting diode of Comparative Example 1 exhibited a distinct yellow color, as shown in FIG. 5A.

Figure 5B:
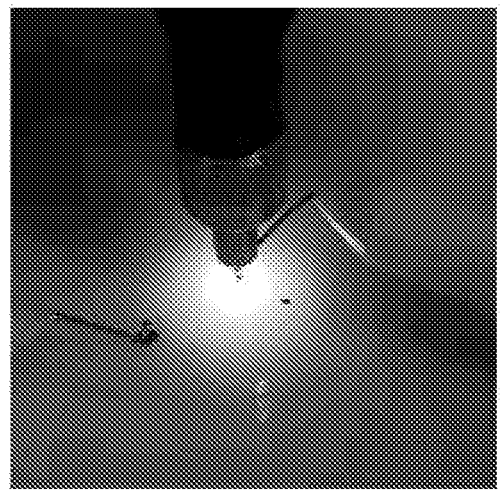
FIG. 5B is a photograph illustrating light emitted from a light emitting diode according to Inventive Example 1.

Referring to FIGS. 4B and 5B, under the current of 50 mA, Inventive Example 1 shows a spectrum of multi bands each having peaks in a yellow wavelength band, a green wavelength band, and a blue wavelength band. Light emitted from the light emitting diode of Inventive Example 1 exhibited cold white color, as shown in FIG. 5B.

Figure 6A:
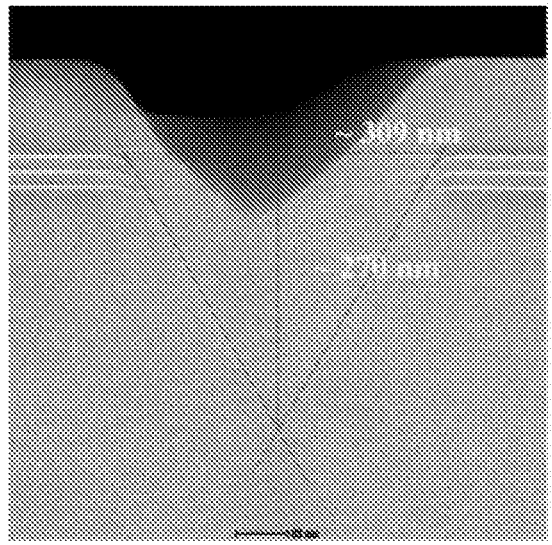
FIG. 6A is a TEM photograph illustrating a V-pit of a yellow light emitting diode according to Comparative Example 1.
Figure 6B:
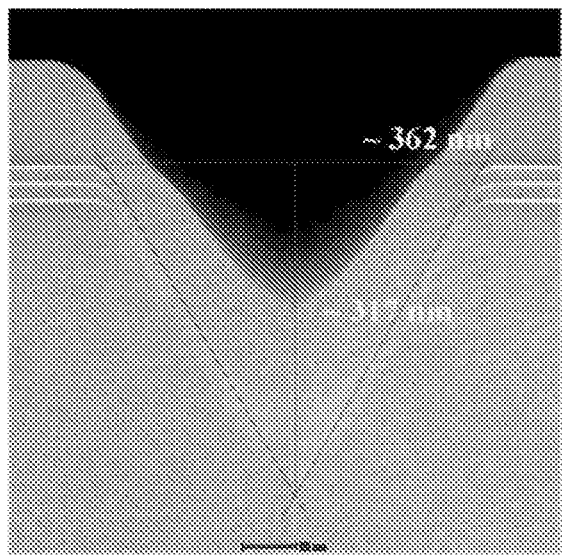
FIG. 6B is a TEM photograph illustrating a V-pit of a light emitting diode according to Inventive Example 1.

Meanwhile, FIG. 6A is a TEM photograph illustrating a V-pit of the yellow light emitting diode according to Comparative Example 1, and FIG. 6B is a TEM photograph illustrating a V-pit of the light emitting diode according to Inventive Example 1.

Referring to FIGS. 6A and 6B, sizes of the V-pits thereof after active layers were formed were about 309 nm and about 362 nm, respectively, and thus, it can be seen that the V-pit of Inventive Example 1 was deeper than that of V-pit of Comparative Example 1. That is, the size of the V-pit may be adjusted by controlling the deposition time of the V-pit generation layer.

In Comparative Example 1 and Inventive Example 1, thicknesses of V-pit generation layers 29 were different, as shown in FIGS. 6A and 6B, and it can be understood that the sizes of the V-pits affected spectral bands. In particular, Inventive Example 1 showed distinct peaks in a wavelength band of the blue light as well as that of the green light. It is understood that this is due to the fact that second well layer portions formed in the V-pit 29v is formed with different compositions and/or different thicknesses from each other.

Figure 6C:
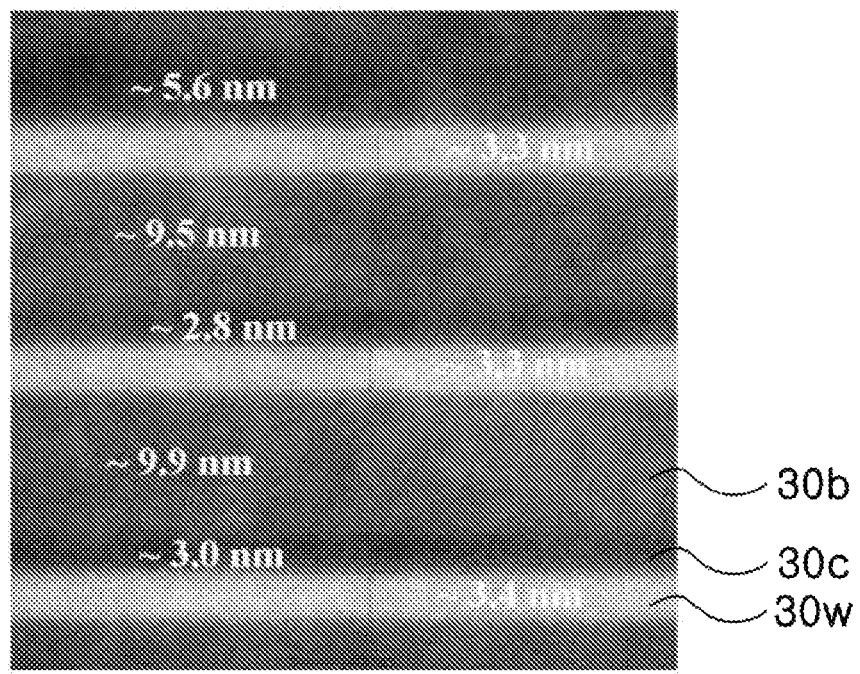
FIG. 6C is an enlarged TEM photograph of a quantum well structure of FIG. 6B.

FIG. 6C is an enlarged TEM photograph of a quantum well structure of FIG. 6B.

Referring to FIG. 6C, it can be seen that the capping layer 30c containing Al is formed on the well layer 30w, and the barrier layer 30b is formed thereon. Herein, it can be seen that a thickness of the well layer 30w is about 3.3 nm-3.4 nm, those of capping layers 30c are about 2.8 nm-3.0 nm.

Meanwhile, it was confirmed that a first well layer portion had a relatively higher Indium (In) content than a second well layer portion through component analysis through APT (Atom Probe Tomography). On an APT graph, the Indium (In) content of the first well layer portion and the Indium (In) content of the second well layer portion were about 25% and about 10.6%, respectively, in a case of Comparative Example 1, and about 25.4% and about 12.6%, respectively, in a case of Inventive Example 1.

Figure 7A:
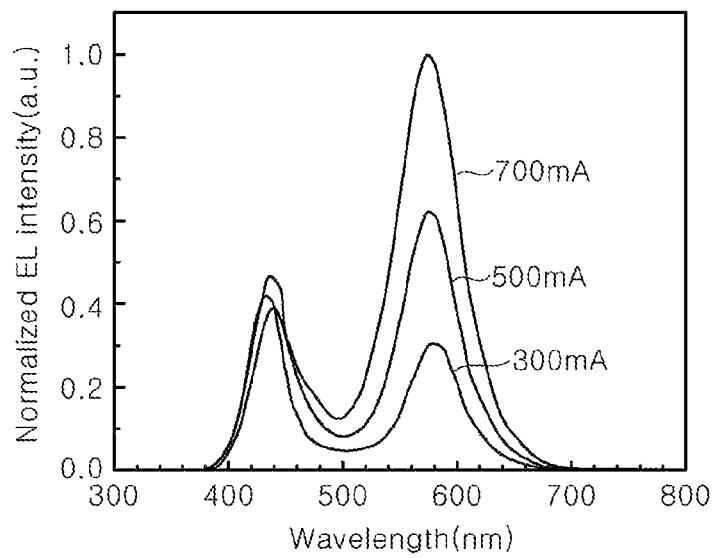
FIG. 7A is a graph showing an emission spectrum of a light emitting diode according to Inventive Example 2.
Figure 7B:
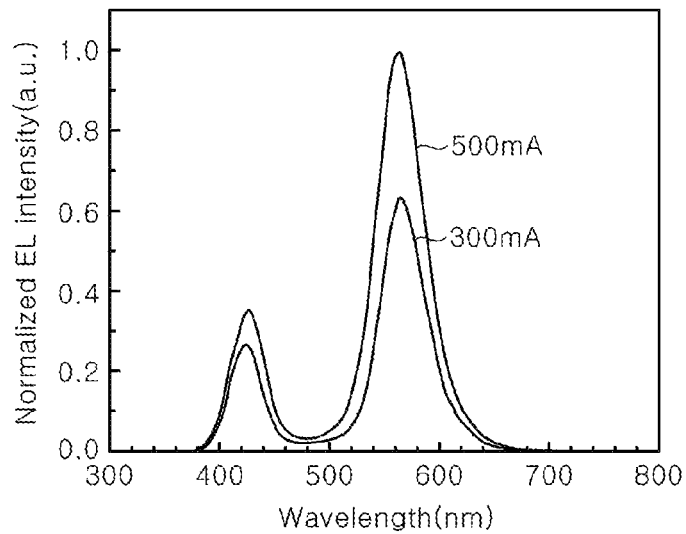
FIG. 7B is a graph showing an emission spectrum of a light emitting diode according to Inventive Example 3.
Figure 8A:
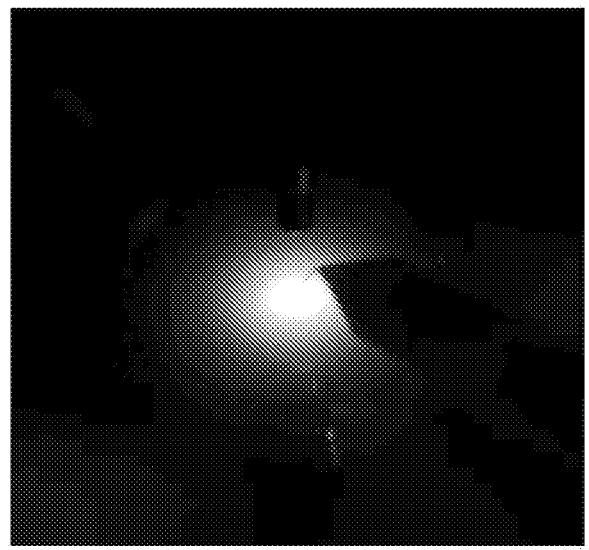
FIG. 8A is a photograph illustrating light emitted from the light emitting diode according to Inventive Example 2.
Figure 8B:
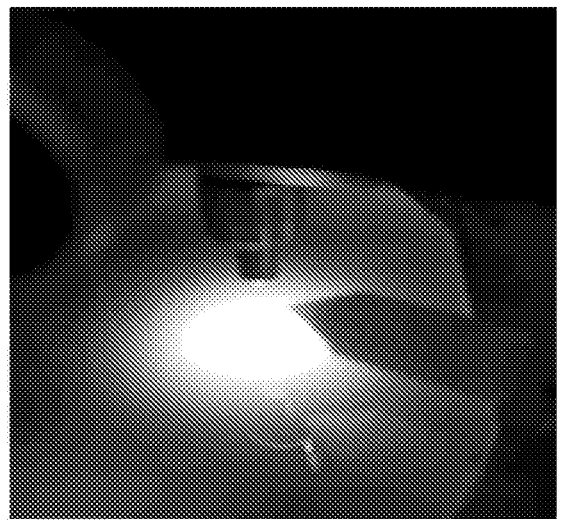
FIG. 8B is a photograph illustrating light emitted from the light emitting diode according to Inventive Example 3.
Figure 9A:
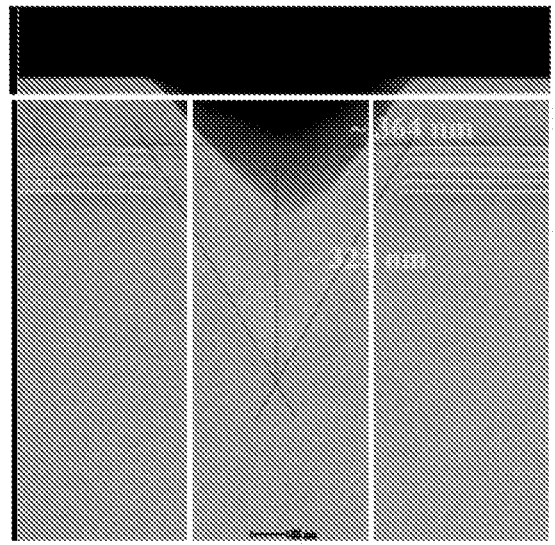
FIG. 9A is a TEM photograph illustrating a V-pit of a light emitting diode according to Inventive Example 2.
Figure 9B:
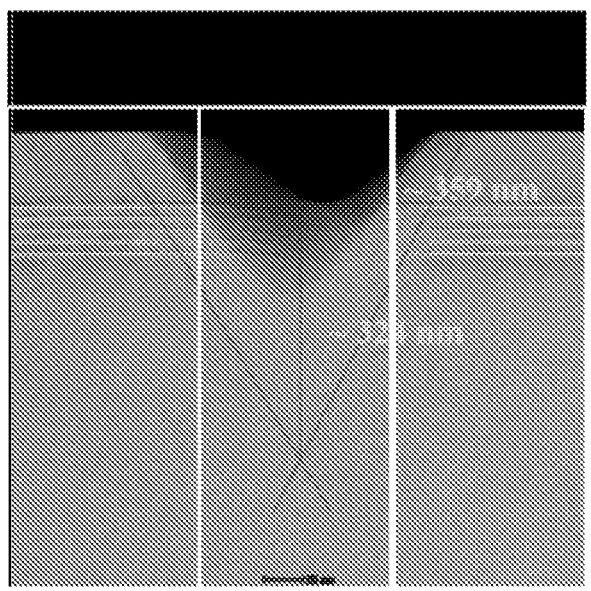
FIG. 9B is a TEM photograph illustrating a V-pit of a light emitting diode according to Inventive Example 3.

FIG. 7A is a graph showing an emission spectrum of a light emitting diode according to Inventive Example 2, and FIG. 7B is a graph showing an emission spectrum of a light emitting diode according to Inventive Example 3. Meanwhile, FIG. 8A is a photograph illustrating light emitted from the light emitting diode according to Inventive Example 2, and FIG. 8B is a photograph illustrating light emitted from the light emitting diode according to Inventive Example 3. In addition, FIG. 9A is a TEM photograph illustrating a V-pit of a light emitting diode according to Inventive Example 2, and FIG. 9B is a TEM photograph illustrating a V-pit of a light emitting diode according to Inventive Example 3.

In the Inventive Examples 2 and 3, a patterned sapphire substrate was used as a growth substrate, and growth conditions of a V-pit generation layer 29 were the same as that in Inventive Example 1, and five well layers were formed in the quantum well structure. However, in the Inventive Example 3, an Indium (In) content contained in the well layer was less than that in Inventive Example 2.

Referring to FIGS. 7A and 7B, both Inventive Examples 2 and 3 showed spectra having a peak wavelength of blue light together with a peak wavelength of yellow light. In addition, as current was increased, intensity of a long-wavelength peak increased more than that of a short-wavelength peak. Moreover, intensity of the short-wavelength peak showed a highest value when the current was 500 mA, and was smaller than the value when the current was 700 mA.

Referring to FIGS. 8A and 8B, under the same current of 300 mA, Inventive Example 2 showed pink color, and Inventive Example 3 showed white light.

Referring to FIGS. 9A and 9B, sizes of the V-pits of Inventive Examples 2 and 3 after active layers were formed were about 364 nm and about 359 nm, respectively, similar to the size of the V-pit of Inventive Example 1. That is, it can be seen that the size of the V-pit is not significantly affected by the type of a flat sapphire substrate or patterned sapphire substrate.

Meanwhile, on the APT graph, Indium (In) contents of a first well layer portion and a second well layer portion were about 26.6% and about 11.6%, respectively, in Inventive Example 2, and about 27% and about 10%, respectively, in Inventive Example 3.

Inventive Example 1 uses a sapphire substrate having a flat surface, and Inventive Examples 2 and 3 use a patterned sapphire substrate as a growth substrate, indicating that spectral band of light emitted from a light emitting diode differs depending on a type of growth substrate.

Figure 10:
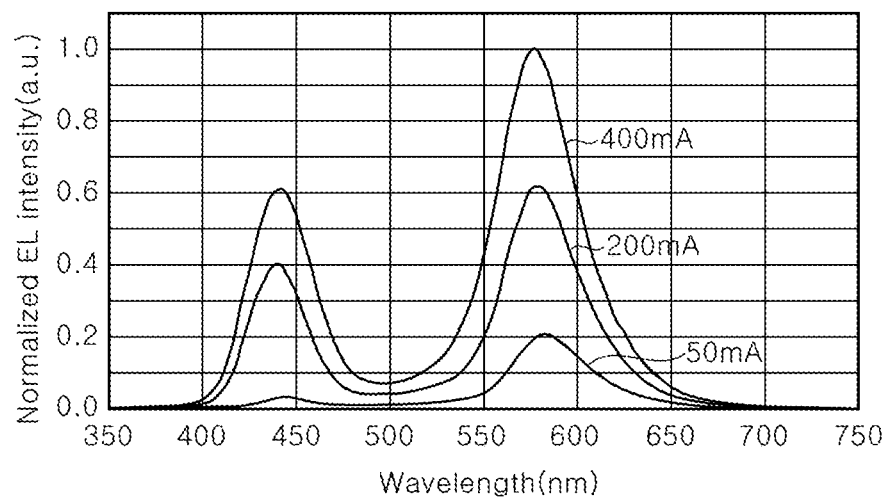
FIG. 10 is a graph showing an emission spectrum of a light emitting diode package according to Inventive Example 4.
Figure 11:
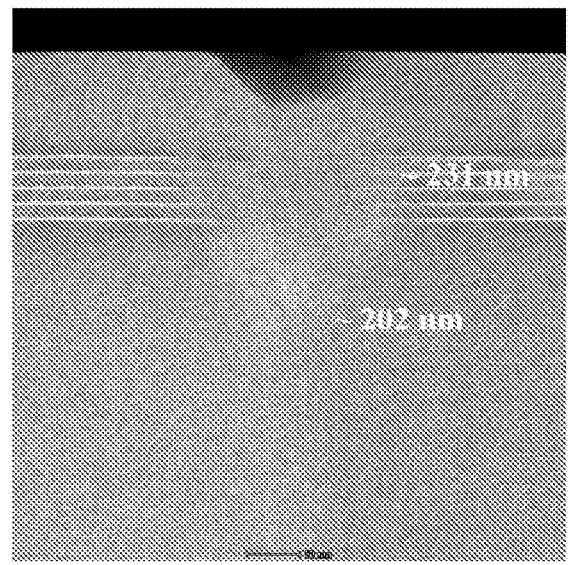
FIG. 11 is a TEM photograph illustrating a V-pit of the light emitting diode according to Inventive Example 4.

FIG. 10 is a graph showing an emission spectrum of a light emitting diode package according to Inventive Example 4, and FIG. 11 is a TEM photograph illustrating a V-pit of the light emitting diode according to Inventive Example 4.

The light emitting diode of Inventive Example 4 was formed under an identical condition as that of Inventive Example 2, except that a deposition time of the V-pit generation layer was reduced. Meanwhile, the light emitting diode of Inventive Example 4 was manufactured as a chip having an area of 480×920 μm², sealed with transparent molding, and then an intensity of electroluminescence (EL) was measured according to wavelengths to obtain a result of FIG. 10.

Referring to FIG. 10, the light emitting diode of Inventive Example 4 clearly shows a peak in a blue region and a peak in a yellow region under a current of 50 mA or more, and intensity increases at a peak wavelength as the current increases.

Referring to FIG. 11, a size of an inlet of the V-pit was about 230 nm. Compared to a case of using a flat sapphire substrate, when a patterned sapphire substrate is used as a growth substrate, a light emitting diode having two distinct peak wavelengths may be provided even though the size of the V-pit is relatively small, as shown in FIG. 11. Meanwhile, in the case of using the flat sapphire substrate, in order to provide a light emitting diode having two or more peak wavelengths with a V-pit size near 230 nm, an Indium (In) composition ratio of a well layer may increase, compared to the case of using the patterned sapphire substrate.

The light emitting diode described above may be manufactured with various chips and used for various purposes. For example, the light emitting diode may be manufactured as a light emitting diode chip having a vertical structure, a lateral structure, or a flip chip structure. In addition, the light emitting diode may be manufactured as a light emitting diode chip having a general size, or may be manufactured as a micro LED or a mini LED. The light emitting diode may be used as a backlight light source or a display light source as well as an illumination light source.

Although some embodiments have been described herein, it should be understood that these embodiments are provided for illustration only and are not to be construed in any way as limiting the present disclosure. It should be understood that features or components of an exemplary embodiment can also be applied to other embodiments without departing from the spirit and scope of the present disclosure.

What is claimed is:

1. A light emitting diode, comprising:
   a V-pit generation layer having a V-pit located in an upper surface of the V-pit generation layer; and
   an active region located on the V-pit generation layer, wherein:
   the active region includes a first well layer formed along the upper surface of the V-pit generation layer and a second well layer formed in the V-pit of the V-pit generation layer, wherein the first well layer has a first Indium composition and the second well layer has a second Indium composition different from the first Indium composition,
   the active region is configured to emit light having at least two peak wavelengths including a first peak wavelength and a second peak wavelength at a single chip level,
   the first peak wavelength is shorter than the second peak wavelength, and
   an intensity of the light at the second peak wavelength is higher than an intensity of the light at the first peak wavelength when a current applied to the light emitting diode is equal to or higher than 50 milliamps.

2. The light emitting diode of claim 1, wherein the first well layer emits light having a first peak wavelength, and the second well layer emits light having at least one second peak wavelength.

3. The light emitting diode of claim 1, wherein the first Indium composition of the first well layer is at least twice the second Indium composition of the second well layer.

4. The light emitting diode of claim 1, wherein: the first well layer emits light having a yellow peak wavelength, and the second well layer emits light having a blue peak wavelength and/or light having a green peak wavelength.

5. The light emitting diode of claim 1, wherein the first well layer has a higher Indium (In) content than that of the second well layer.

6. The light emitting diode of claim 5, wherein the first well layer is thicker than the second well layer.

7. The light emitting diode of claim 5, wherein the active region further includes:
   a first capping layer located on the first well layer;
   a second capping layer located on the second well layer;
   a first barrier layer located on the first capping layer; and
   a second barrier layer located on the second capping layer,
   wherein the first and second capping layers prevent Indium from being dissociated into the corresponding first and second barrier layers.

8. The light emitting diode of claim 7, wherein the first capping layer has an Aluminum composition higher than an Aluminum composition of the second capping layer.

9. The light emitting diode of claim 1, wherein the V-pit generation layer has a thickness exceeding 450 nm.

10. The light emitting diode of claim 9, wherein the V-pit formed in the V-pit generation layer has a width of an inlet exceeding 230 nm.

11. The light emitting diode of claim 1, further comprising:
   an n-type semiconductor layer, wherein the V-pit generation layer is located over the n-type semiconductor layer; and
   a p-type semiconductor layer located above the active region.

12. The light emitting diode of claim 11, wherein the semiconductor layers are nitride semiconductor layers.

13. The light emitting diode of claim 11, wherein the p-type semiconductor layer includes a concave portion on the V-pit in the V-pit generation layer.

14. The light emitting diode of claim 1, wherein the active region contacts the V-pit generation layer.

15. A light emitting diode, comprising:
   a V-pit generation layer having a V-pit located in an upper surface of the V-pit generation layer;
   an active region located on the V-pit generation layer; and
   a p-type layer located directly on the active region, wherein:
      the active region includes a first well layer formed along the upper surface of the V-pit generation layer and a second well layer formed in the V-pit of the V-pit generation layer,
      the first well layer has a first Indium composition and the second well layer has a second Indium composition different from the first Indium composition,
      the light emitting diode is configured to emit light having a first peak wavelength and a second peak wavelength that is longer than the first peak wavelength, and
      an intensity of the light at the second peak wavelength is higher than an intensity of the light at the first peak wavelength when a current applied to the light emitting diode is equal to or higher than 50 milliamps.

16. The light emitting diode of claim 15, wherein the first well layer has a higher Indium (In) content than that of the second well layer.

17. The light emitting diode of claim 15, wherein the second well layer emits light having at least two peak wavelengths, the two peak wavelengths being different from a first peak wavelength emitted by the first well layer.

18. The light emitting diode of claim 15, wherein the p-type layer is represented by a general formula of $Al_xGa_{1-x}N$, and a composition ratio x of Al in the p-type layer is greater than 0 and less than 0.3.

19. The light emitting diode of claim 18, further comprising a second p-type layer located on the p-type layer, wherein the p-type layer located directly on the active region has a thickness of less than 100 nm.

20. The light emitting diode of claim 15, wherein: the V-pit generation layer has a thickness exceeding 450 nm, and the V-pit formed in the V-pit generation layer has a width of an inlet exceeding 230 nm.

21. A light emitting diode package, comprising:
at least one light emitting diode, the at least one light emitting diode including:
   a V-pit generation layer having a V-pit located in an upper surface of the V-pit generation layer; and
   an active region located on the V-pit generation layer, wherein:
      the active region includes a first well layer formed along the upper surface of the V-pit generation layer and a second well layer formed in the V-pit of the V-pit generation layer, wherein the first well layer has a first Indium composition and the second well layer has a second Indium composition different from the first Indium composition,
      the active region is configured to emit light having at least two peak wavelengths including a first peak wavelength and a second peak wavelength at a single chip level,
      the first peak wavelength is shorter than the second peak wavelength, and
      an intensity of the light at the second peak wavelength is higher than an intensity of the light at the first peak wavelength when a current applied to the light emitting diode is equal to or higher than 50 milliamps.

22. A lighting apparatus, comprising:
at least one light source, the at least one light source including at least one light emitting diode, the at least one light emitting diode including:
   a V-pit generation layer having a V-pit located in an upper surface of the V-pit generation layer; and
   an active region located on the V-pit generation layer, wherein:
      the active region includes a first well layer formed along the upper surface of the V-pit generation layer and a second well layer formed in the V-pit of the V-pit generation layer, wherein the first well layer has a first Indium composition and the second well layer has a second Indium composition different from the first Indium composition,
      the active region is configured to emit light having at least two peak wavelengths including a first peak wavelength and a second peak wavelength at a single chip level,
      the first peak wavelength is shorter than the second peak wavelength, and
      an intensity of the light at the second peak wavelength is higher than an intensity of the light at the first peak wavelength when a current applied to the light emitting diode is equal to or higher than 50 milliamps.

\* \* \* \* \*